United States Patent [19]
Larson

[11] Patent Number: 5,371,699
[45] Date of Patent: Dec. 6, 1994

[54] NON-VOLATILE FERROELECTRIC MEMORY WITH FOLDED BIT LINES AND METHOD OF MAKING THE SAME

[75] Inventor: William L. Larson, Colorado Springs, Colo.

[73] Assignee: Ramtron International Corporation, Colorado Springs, Colo.

[21] Appl. No.: 977,825

[22] Filed: Nov. 17, 1992

[51] Int. Cl.$^5$ .............................................. G11C 11/22
[52] U.S. Cl. ...................... 365/145; 365/51; 365/63; 257/295
[58] Field of Search ............... 365/145, 63, 51; 257/295

[56] References Cited

U.S. PATENT DOCUMENTS 4,873,664 10/1989 Eaton, Jr. ........................ 365/145
5,070,385 12/1991 Evans, Jr. et al. ............... 365/145 X
5,099,305 3/1992 Takenaka ........................ 365/145 X

FOREIGN PATENT DOCUMENTS 4118847 12/1991 Germany.

*Primary Examiner*—Do Hyun Yoo
*Attorney, Agent, or Firm*—Edward D. Manzo; Mark J. Murphy; John J. King

[57] ABSTRACT

A non-volatile ferroelectric memory having folded bit lines both reduces the size of the memory while also eliminating noise interference commonly associated with non-volatile ferroelectric memories having an open bit line architecture. The memory provides two pairs of coincident word and plate lines associated with each row, viz., plate line A paired with word line B, and plate line B paired with word line A. The plate line of a pair may overlie or underlie the word line of the pair, and one may have the same width or a different width as the other of the pair, but preferably the elements of the pair are generally aligned, and the elements of the other pair are aligned with themselves, the two pairs being distally spaced apart. Each cell in the row is connected at the appropriate location to a word line of one of the pairs and a plate line of the other pair. Therefore, the word line and plate line of any single cell are not coincident. Further, adjacent cells in any row do not share the same word line or plate line, but are connected to the other word line or plate line.

13 Claims, 7 Drawing Sheets

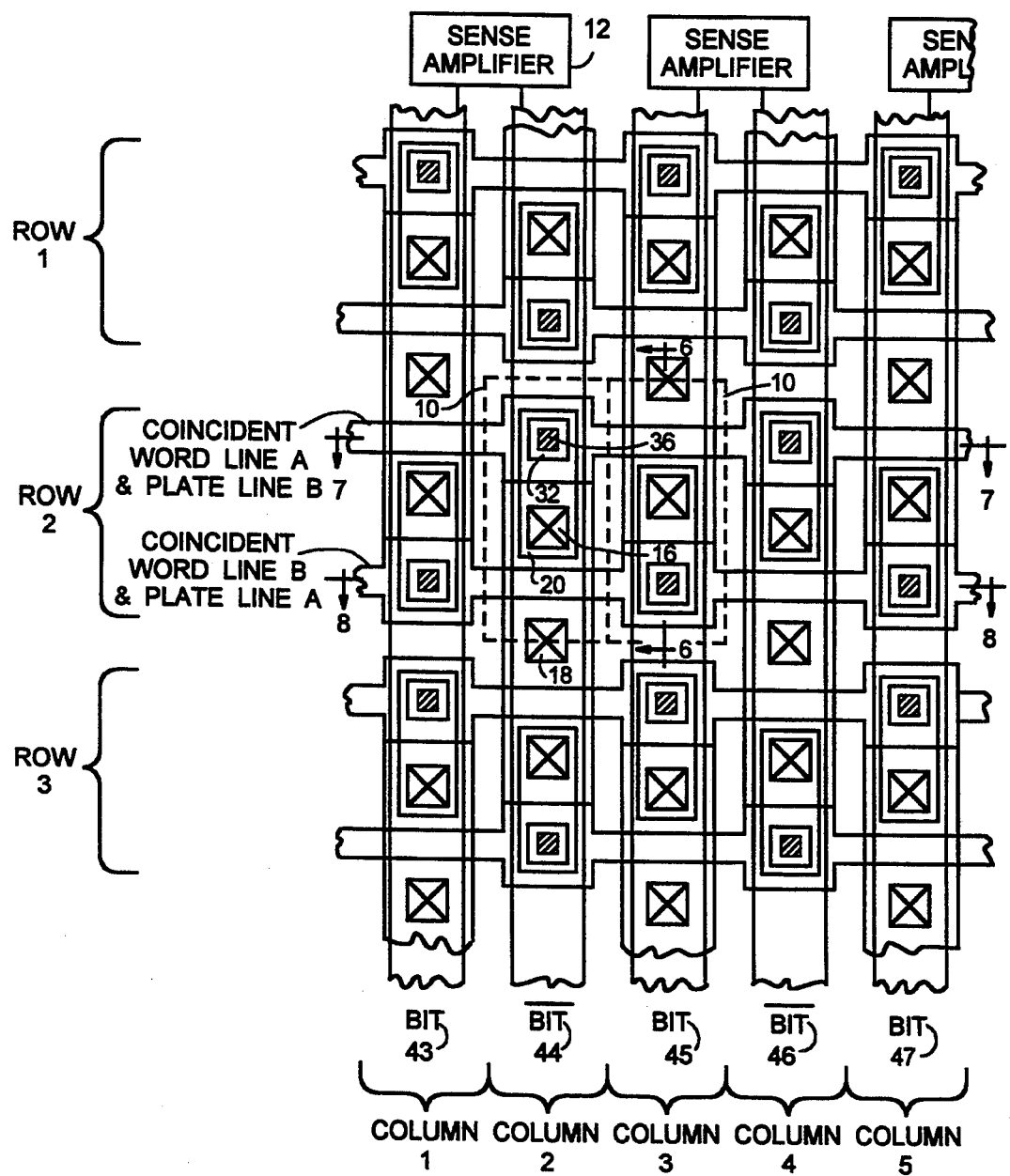

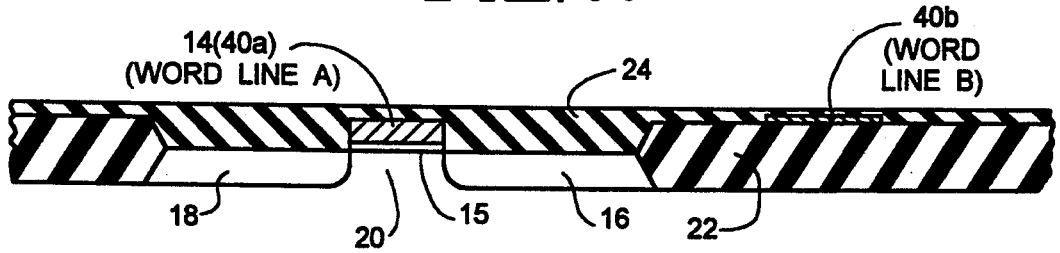
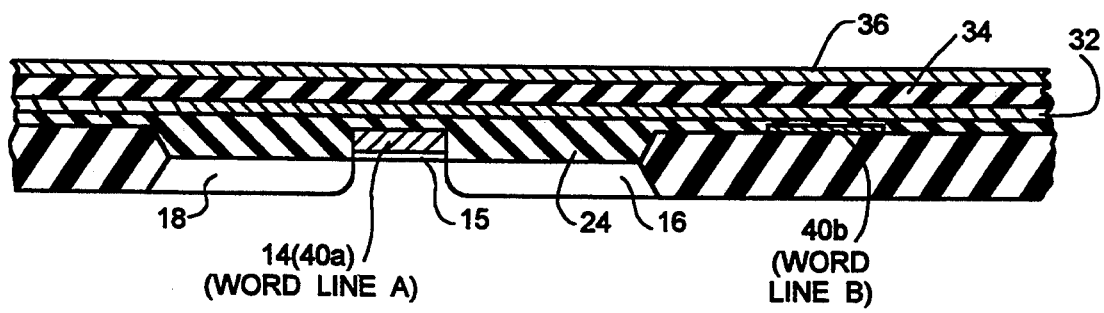
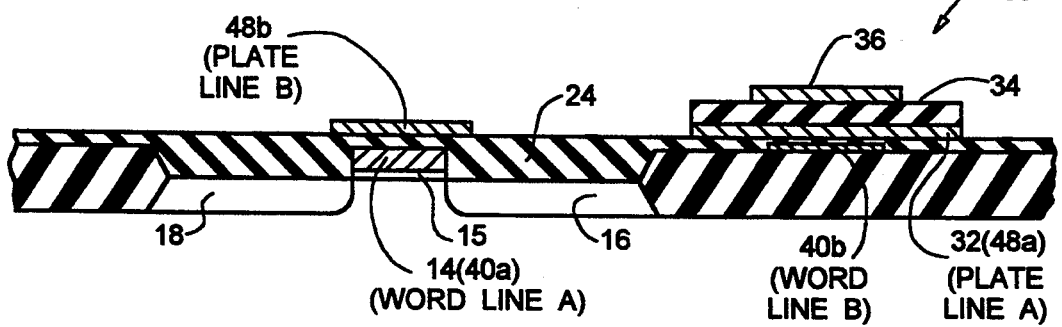
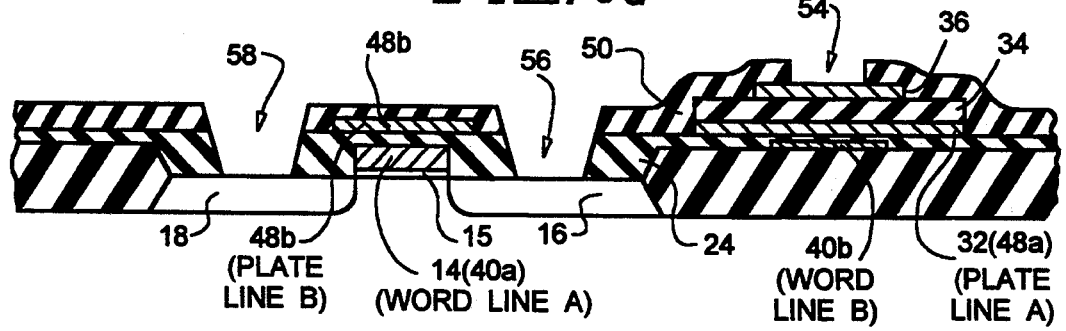

NON-VOLATILE FERROELECTRIC MEMORY WITH FOLDED BIT LINES AND METHOD OF MAKING THE SAME

FIELD OF THE INVENTION

This invention relates to a non-volatile ferroelectric memory, and more particularly to a non-volatile ferroelectric memory having a folded bit line architecture.

DESCRIPTION OF THE PRIOR ART

The conventional (i.e., volatile) DRAM cell, as shown in FIG. 1, includes a pass transistor and a linear dielectric capacitor for storing data. A conventional DRAM cell does not rely on remanent polarization or polarization state of a ferroelectric dielectric in the capacitor as the storage mechanism, but relies instead on the charge stored in the capacitor. A conventional DRAM cell is interconnected with two controllable lines: a bit line and a word line. Where field effect transistors are used, the bit line is coupled usually to the drain of the transistor and the word line is coupled to the control electrode of the transistor. The source of the (pass) transistor is connected to the top electrode of the capacitor, and the bottom electrode of the capacitor is usually grounded or connected to the bottom electrodes of the capacitors of all of the cells in the memory and to ground.

In contrast, a non-volatile ferroelectric cell uses remanent polarization for storage and is coupled to three controllable lines. The non-volatile ferroelectric cell shown in FIG. 2 includes a bit line, a word line and a plate line. Unlike a conventional DRAM, the plate line is also a controllable line. (But see Eaton and Proebsting, U.S. Pat. No. 4,491,936 "Dynamic Random Access Memory Cell with Increased Signal Margin"). The plate line is not common to all cells in the memory device, but only those cells (in the row or otherwise) associated with the plate line. The plate line must be separately controlled for a memory cell to accomplish non-volatile reading and/or writing.

To read from a nonvolatile ferroelectric memory, a sense amplifier generally compares the state (polarization of ferroelectric material) of the bit line to the state of the bit line (a reference line) to determine the polarization of the ferroelectric material (representing data—for example, a binary "1") in the memory cell. Presently, all non-volatile ferroelectric memory designs using one transistor and one capacitor in each memory cell employ (upon information and belief) open bit line architecture as illustrated in FIG. 3a to minimize the cell area. However, a memory employing open bit line architecture is susceptible to noise interference which reduces the signal-to-noise ratio of the memory. This is particularly true for high density memory arrays, such as a 256 K memory or greater, where the reduction in cell geometry leads to a lower signal level.

The noise interference associated with the open bit architecture of the prior art is apparent in view of the block diagram in FIG. 3a showing the positioning of the sense amp and the memory cells in the memory. The bit line and the bit line associated with a sense amplifier are on opposite sides of the sense amplifier. Therefore, noise may be induced on one side of the sense amplifier, for example on the bit line, and not induced on the other side of the sense amplifier, on the bit line.

An example of a ferroelectric memory having open bit line architecture is shown in FIG. 3b, although other configurations are well known in the art. In this layout, the word line and plate line corresponding to any memory cell associated with a row are coincident (i.e. one lies generally on top of the other over a run in the same direction and is separated therefrom by an insulating layer). Memory cells 10 in any single row share a corresponding single word line and (preferably, a) single plate line. This arrangement is possible because the bit lines and the associated bit lines are on opposite sides of the respective sense amplifiers 12. The cells on opposite sides of the sense amplifier are coupled to different rows of word lines 40 and plate lines 48, and therefore the state of a cell can be determined by accessing a row on each side of the sense amplifier. The pass transistor of cell 10 including source 16, drain 18 and active region 20 is shown. Finally, an interconnect 60 between the source 16 of the transistor and the capacitor 30 can be seen.

In order to solve the problem of noise interference associated with open bit line architecture, memories may be considered employing folded bit line architecture as shown in the block diagram of FIG. 4a. Generally, in a memory employing folded bit architecture, a sense amplifier compares the state (polarization of ferroelectric material) of the bit line to the state of the bit line, on the same side of the sense amplifier, to determine the polarization of the ferroelectric material (representing data—for example, a binary "1") in the memory cell.

However, because the cells associated with a given bit line cannot share the same word and plate lines with cells of the associated bit line, folded bit line architecture generally increases the size of the memory. As shown in FIG. 4a, the bit lines are associated with Rows 1 and 3, while the bit lines are associated with Rows 2 and 4. As is apparent in FIG. 4b, the cells on the same side of the sense amplifier 12 are coupled to different rows of word lines 40 and plate lines 48. Therefore the state of a cell can be determined by accessing rows on the same side of the sense amplifier. The pass transistor of cell 10 including source 16, drain 18 and active region 20 is shown. Also, an interconnect 60 between the source 16 of the transistor and the capacitor 30 can be seen. However, as is apparent, this non-volatile ferroelectric memory having folded bit architecture approximately doubles the size of the memory. This conflicts with one principal goal of memory design, which is to reduce the memory area.

An object of the invention is to provide a non-volatile ferroelectric memory layout or architecture having a reduced size.

A further object of the invention is to provide a non-volatile ferroelectric memory with folded bit line architecture.

A further object of the invention is to provide a non-volatile ferroelectric memory with folded bit line architecture having a greater signal-to-noise ratio.

SUMMARY OF THE INVENTION

The non-volatile ferroelectric memory having folded bit lines of the present invention is designed to both reduce the area of the memory while also eliminating noise interference commonly associated with non-volatile ferroelectric memories having an open bit line architecture. A non-volatile ferroelectric memory according to some aspects of the present invention includes a plurality of cells (an array or sub-array) arranged in a matrix defined by rows and columns, each cell including a transistor and a corresponding ferroelectric capacitor. Each transistor has a first electrode, a second electrode and a control electrode, and each capacitor has a first electrode and a second electrode separated by dielectric consisting of or including, alone or with other dielectrics, a ferroelectric material. The second electrode of the transistor is coupled to the first electrode of the capacitor.

The memory further includes a plurality of bit lines, word lines and plate lines. Each bit line is associated with a single column and is connected to the first electrodes of the transistors of each cell associated with that bit line. Preferably, first and second word lines and first and second plate lines (coincident with the first and second word lines respectively) are associated with each row. The first word line is connected to the control electrode of the transistor of a first cell and said second word line is connected to the control electrode off the transistor of a second cell, adjacent to the first cell in that row of the matrix. The first plate line is connected to the second electrode of the capacitor of the second cell and the second plate line is connected to the second electrode of the capacitor of the first cell.

Therefore, in this aspect of the invention, the word line and plate line coupled to any single cell are not co-linear. Further, adjacent cells in any row do not share the same word line or plate line, but are connected to the other word line or plate line associated with the row. This pattern continues for all cells in a matrix defined by any given number of cells in a row or column. The present design results in a non-volatile ferroelectric memory having a folded bit architecture with reduced size relative to a memory having open bit architecture.

The operation of a three-line ferroelectric memory cell of the type used herein (i.e. reading from, writing to, and restoring the data in a cell of a ferroelectric memory) is known in the art. The entire disclosure of U.S. Pat. No. 4,873,664 to S. Sheffield Eaton, Jr. directed to a "Self-Restoring Ferroelectric Memory" is incorporated herein by reference. The disclosure of Eaton, Jr. '664 relates to memory cells of a non-volatile ferroelectric memory, and particularly to a one transistor-one capacitor memory cell (as shown, for example, in its FIG. 3). Although that FIG. 3 of Eaton, Jr. shows a ferroelectric memory cell having open bit line architecture and employing a dummy cell, the means for reading or writing to a memory cell disclosed in Eaton, Jr. —664 is applicable to the present invention. However, the dummy cell of Eaton, Jr. would be a regular memory cell of the present invention and would be positioned on the same side of the sense amplifier as the operational cell.

BRIEF DESCRIPTION OF THE DRAWINGS

In describing the invention, reference is made to the accompanying drawings. It should be noted that in some "plan view" figures, the lines hidden from view by overlying members or structure have been drawn fully. In the drawings:

FIG. 5 is a representative plan view of the non-volatile ferroelectric memory array portion having folded bit lines according to the present invention.

DESCRIPTION OF THE PREFERRED EMBODIMENT

A non-volatile ferroelectric memory having folded bit lines of the present invention both reduces the size of the memory while also eliminating or severely limiting noise interference commonly associated with non-volatile ferroelectric memories having an open bit line architecture. In order to reduce the size of a non-volatile ferroelectric memory having folded bit line architecture, the preferred embodiment of the present invention as shown in FIG. 5 provides a non-volatile ferroelectric memory array having two pairs of coincident word and plate lines associated with each row. In each pair, the word and plate lines are coincident in plan view but not in cross-section view. These may be called "pair A" and "pair B." Each cell in the row is connected at the appropriate location to a word line of one of the pairs and a plate line of the other pair. Therefore, the word line and plate line coupled to any given single cell are not coincident. Rather, the plate line connected to a given memory cell is coincident with the word line connected to the adjacent memory cell in an adjacent column. To further reduce the area of the memory, pairs of adjacent cells in each column share drain regions as is well known in the art.

As shown in FIG. 5, the memory array of the present embodiment of the invention employs folded bit line architecture wherein the bit and $\overline{bit}$ lines are located on the same side of the sense amplifier 12. As a result, any noise induced on the bit line most likely will be induced on the $\overline{bit}$ line also, thereby limiting the effect of noise in the circuit. These features of the present invention, which both reduce the size of the memory and provide folded bit line architecture, will become apparent in reference to the remaining cross sectional drawings of the non-volatile ferroelectric memory array architecture of the present invention. In FIG. 5, five columns are shown as Column 1, Column 2 . . . Column 5. Each column includes a bit line, viz. 43, 44, 45, 46 and 47. Only three of the rows are shown, as Row 1, Row 2, and Row 3. It will be understood that the numbers of rows, columns, and cells per column are generally much greater than the representation at FIG. 5.

FIGS. 6a–g are cross-sections of a single memory cell of the present invention shown in FIG. 5 (taken at lines 6—6) and show the application of the various layers in making a single memory cell. It is to be understood that the various layers and structures shown in FIGS. 6 are representative of the layout or structure of the device and are not necessarily drawn to scale.

Figure 1:
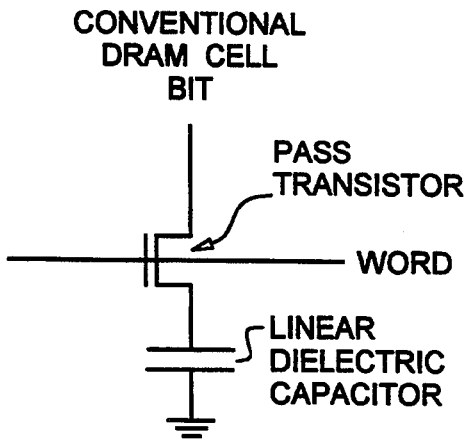
FIG. 1 is a schematic diagram of a conventional DRAM cell.
Figure 2:
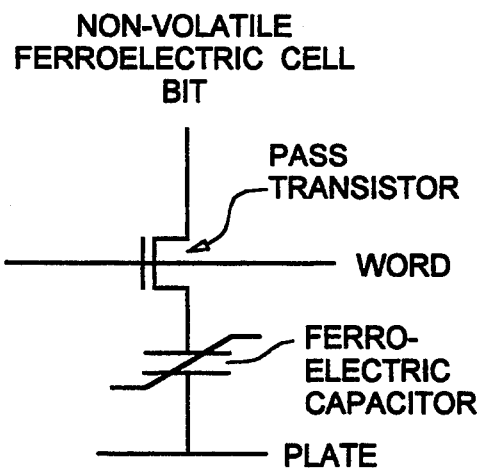
FIG. 2 is a schematic diagram of a conventional non-volatile ferroelectric cell.
Figure 3A:
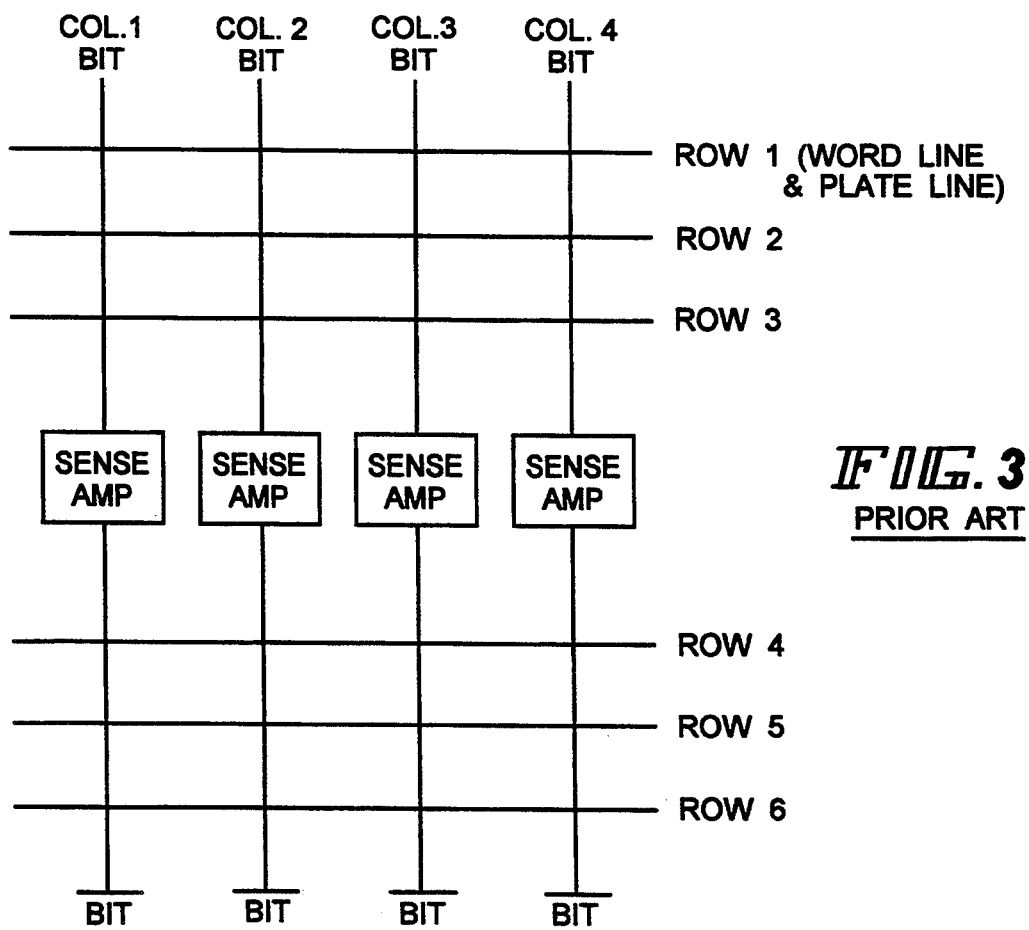
FIG. 3a is a block diagram of a part of a conventional non-volatile ferroelectric memory array having open bit fines showing the location of the memory cells and the sense amplifier.
Figure 3B:
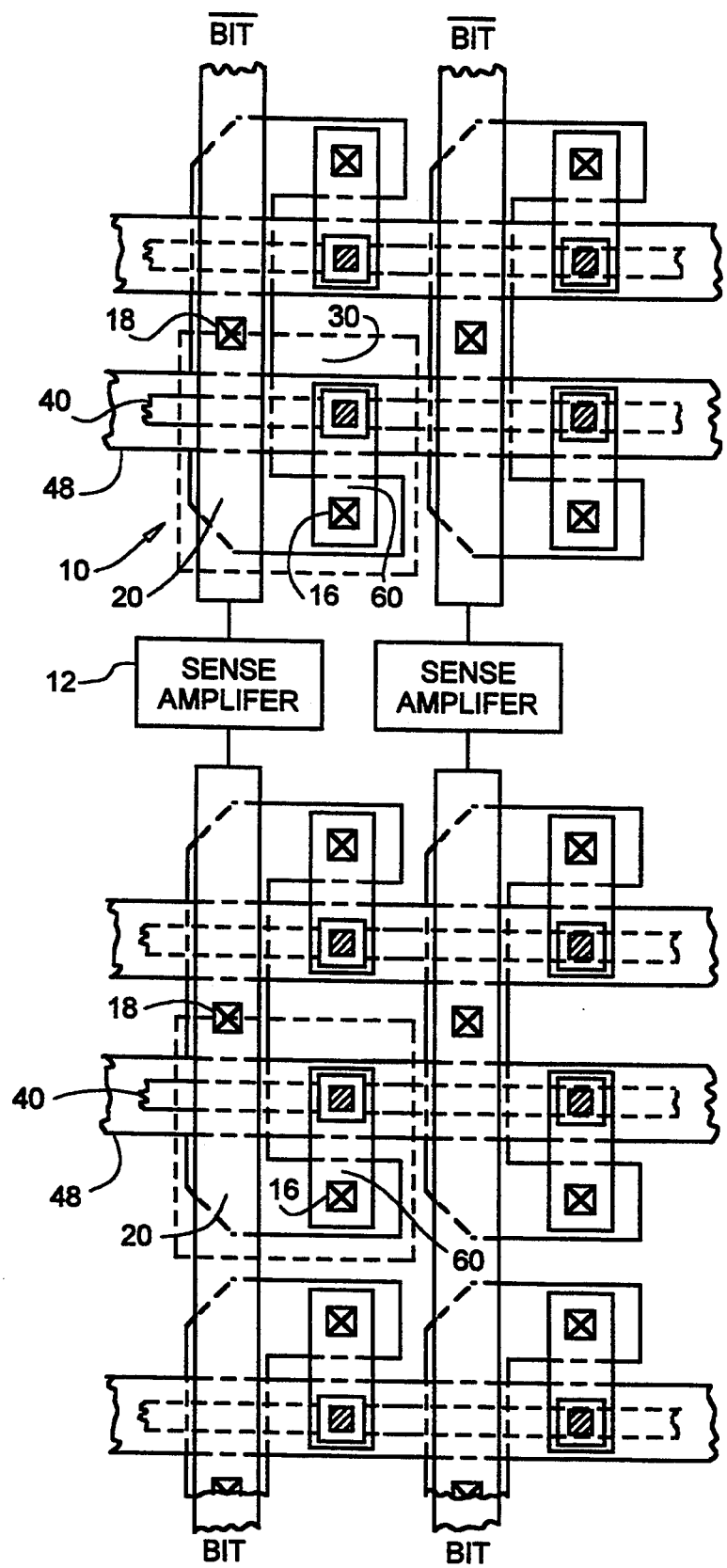
FIG. 3b is a representative plan view of part of a conventional non-volatile ferroelectric memory array having open bit lines.
Figure 4A:
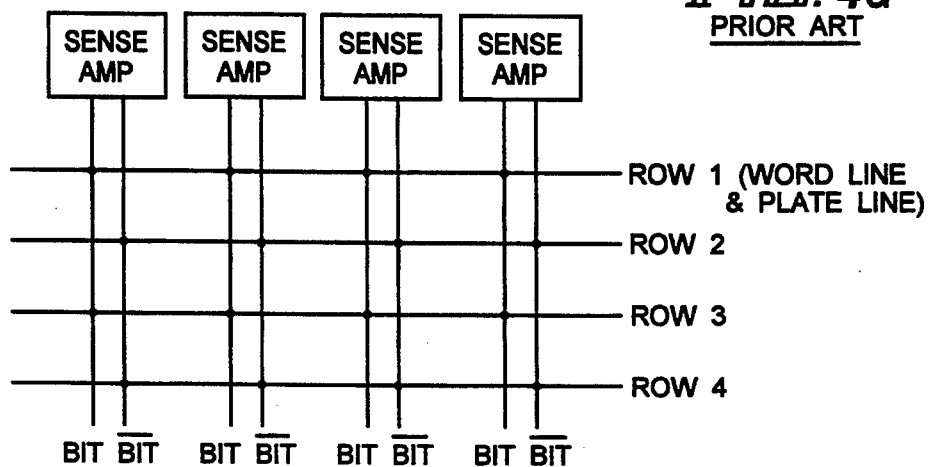
FIG. 4a is a block diagram of part of a non-volatile ferroelectric memory array having folded bit lines showing the location of the .memory cells and the sense amplifiers.
Figure 4B:
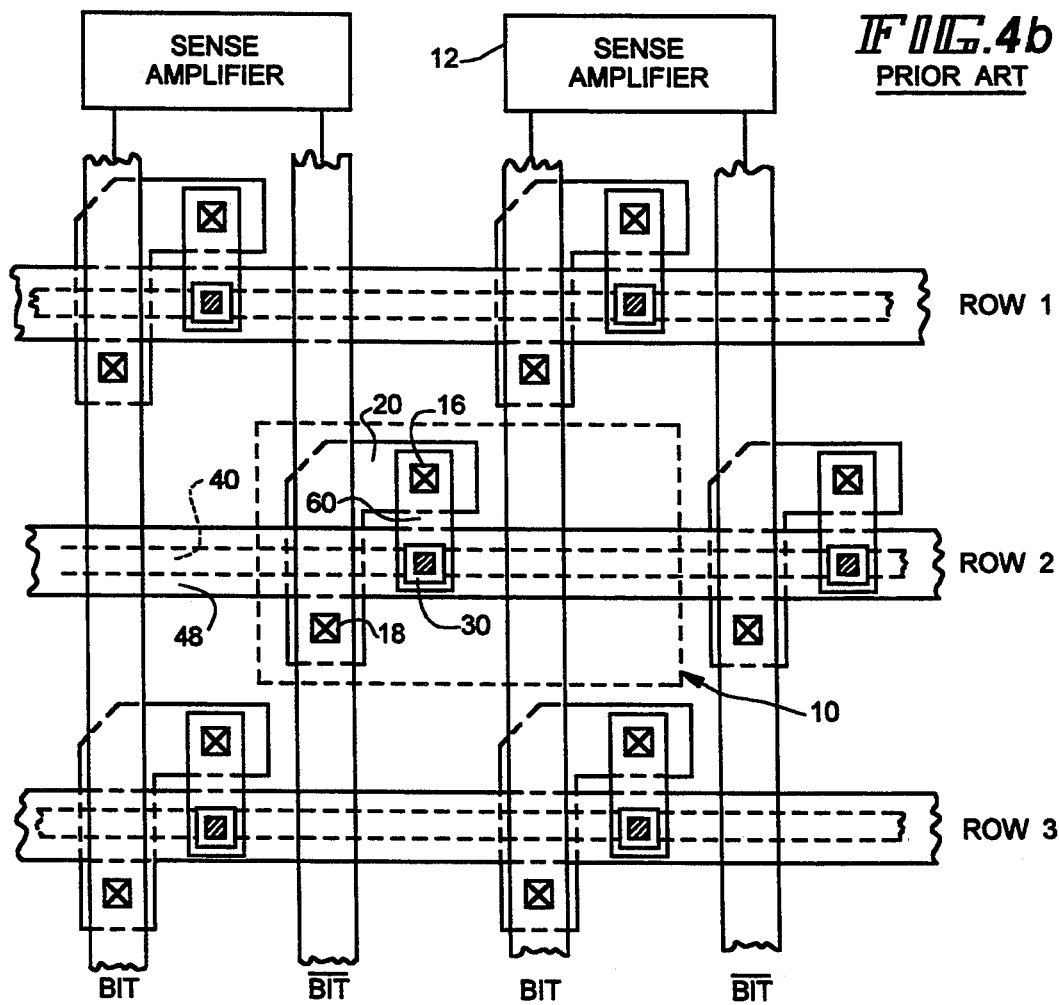
FIG. 4b is a representative plan view of part of a conventional non-volatile ferroelectric memory array having folded bit lines.

Turning now to FIG. 6a, conventional silicon CMOS processing is used to produce a pass transistor (see also FIG. 2). Although any suitable transistor could be used, an n-channel field effect transistor (FET) is preferably used. A gate electrode 14, preferably formed of doped polysilicon, is formed, and source and drain regions 16, 18 are formed by introducing (driving) commonly known dopants into a preferably silicon substrate. Preferably a self-alignment process is employed. It will be understood that other semiconductor substrates may be feasible. Also, it is noted that in the drawings, the gate electrode is illustrated with lining for a metallic substance, which it could be, but preferably the gate electrode is formed of conductive (i.e. doped) polycrystalline silicon or substitutes therefor. The gate electrode 14 is generally applied over a thin oxide layer 15 as is known in the art to form a metal oxide semiconductor (MOS) transistor.

Figure 6E:
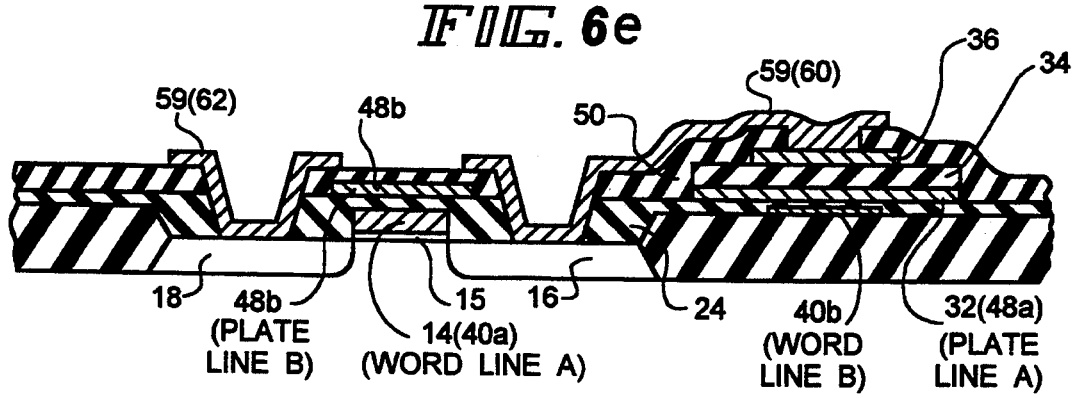
FIGS. 6(a–g) are cross sections of a single cell of the non-volatile memory taken at lines 6—6 during the processing steps of the memory of FIG. 5.
Figure 6F:
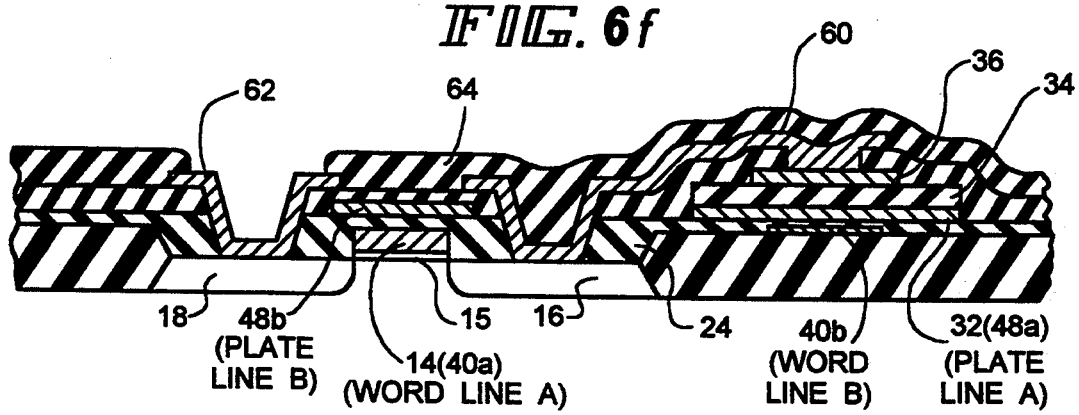
Figure 6G:
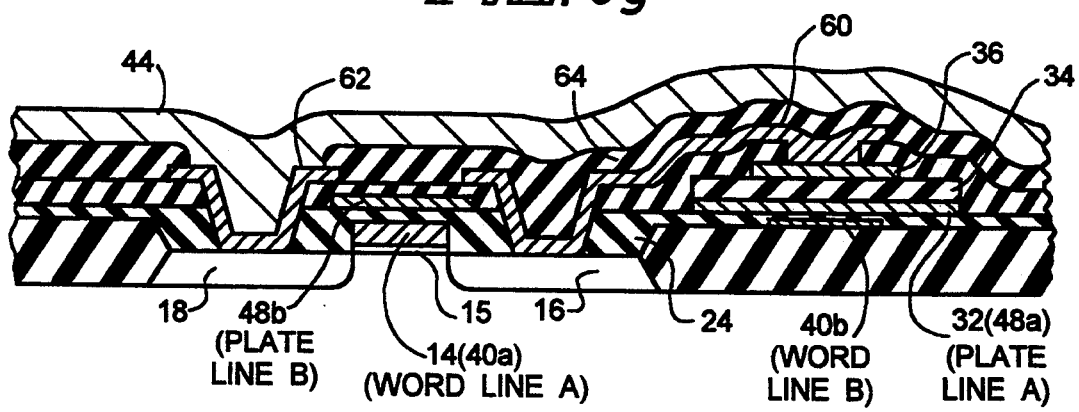
Figure 7:
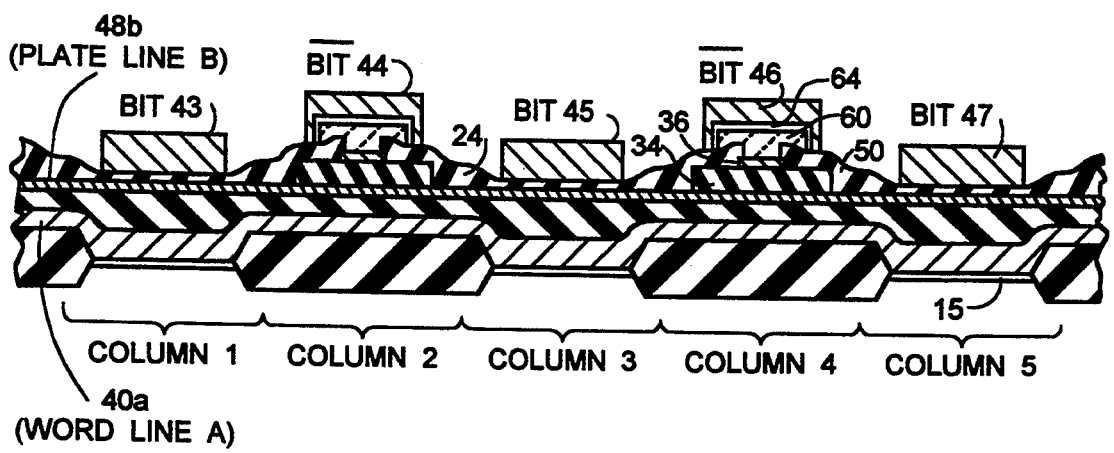
FIG. 7 is a cross section of the non-volatile memory array portion of FIG. 5 taken at lines 7—7.

A word line 40a, shown also in the cross section of FIG. 7, forms the gate electrode 14 of the transistor and the gate electrodes of some other transistors in the row containing the cell of FIG. 6. A second word line 40b, shown also in the cross section of FIG. 8, also associated with the cells in the row containing the cell of FIG. 6, is formed on the separation or isolation oxide layer 22. Second word line 40b forms the gate electrodes of transistors in the columns directly adjacent to the single cell designated by lines 6—6 in FIG. 5. After these two (and other) word lines are formed, a first insulating layer 24, such as an oxide or other suitable insulator, is applied over the pass transistor and the word lines 40a and 40b.

As shown in FIG. 6b, a ferroelectric capacitor is formed on the oxide layer adjacent to the pass transistor. A bottom electrode layer 32, preferably consisting of titanium and platinum, or a conductive oxide such as ruthenium dioxide, is deposited. The bottom electrode 32 preferably has a thickness of 500 Å to 3000 Å and is deposited by a sputtering technique. However, the bottom electrode consisting of a suitable material for an electrode can be deposited to any thickness to form an electrode of the capacitor.

Next, a ferroelectric layer 34 is formed over the bottom electrode during the formation of the capacitor. The stoichiometry or composition of the ferroelectric layer is preferably $Pb(Ti_xZr_{(1-x)})O_3$ where x is a number between 0.2 and 0.8. Preferably, the thickness of the ferroelectric layer is between 1000 Å and 5000 Å and can be deposited by sputtering or by using a sol-gel technique. However, a layer having a different thickness of any other suitable ferroelectric material can be applied. Some other ferroelectric materials are Phase III potassium nitrate, bismuth titanate and the PZT family of lead zirconate titanate compounds. Finally, the layer for the top electrode 36, which is preferably platinum or a conductive oxide, is deposited by sputtering. The top electrode, which has a thickness of approximately 500 Å A to 3000 Å, completes the ferroelectric capacitor.

As shown in FIG. 6c, the top electrode layer 36 is defined (etched), and the ferroelectric layer 34 and the bottom electrode 32 are defined and etched, leaving the lower contact 32 and a portion of the ferroelectric dielectric layer 34 on top of the lower contact. As will become more apparent in reference to FIGS. 7 and 8, a plate line 48b (forming the bottom electrode of the capacitor for example in col. 2 (FIG. 7)) and a plate line 48a (forming the bottom electrode of cells in adjacent columns 1 and 3 of the row (FIG. 8)) remain after the etching step.

Referring now to FIG. 6d and having formed both the pass transistor and the ferroelectric capacitor, it is necessary to couple the upper plate of the capacitor to the source electrode of the transistor (as shown in the schematic diagram of the non-volatile ferroelectric memory cell in FIG. 2). As shown in FIG. 6d, a second insulating layer 50 is applied over the newly formed capacitor 30 and the oxide layer 24 over the transistor. Preferably, the second insulating layer 50 is applied by chemical vapor deposition (CVD) to a thickness approximately between 2000 Å and 6000 Å. To form the required contact regions for the bit line (or $\overline{bit}$ line) and the connection between the source region 16 of the transistor and the upper plate 36 of the capacitor, a top electrode contact aperture 54 and source and drain contact apertures 56 and 58 are simultaneously etched.

Turning to FIG. 6e, a contact layer 59 is then applied. The layer is then etched to define a conductive local interconnect layer 60 and a conductive drain contact 62 which are shown in FIG. 6e. The local interconnect layer 60 connects the source region 16 to the upper electrode 36 of the capacitor 30 (as is shown in the non-volatile ferroelectric memory cell shown in the schematic diagram of FIG. 2). The interconnect layer 60 and drain contact 62 are preferably deposited by sputtering and have a thickness of approximately 500 Å to 5000 ÅA.

The composition of the local interconnect layer 60 may be a refractory metal, refractory metal nitride, refractory metal silicide or a conductive oxide. Although aluminum could be used, the use of aluminum is generally avoided in the local interconnect layer. Specifically, aluminum may react with the platinum (in the top electrode 36 of the ferroelectric capacitor) at temperatures as low as 250° C., rendering the top electrode inoperable. Using refractory metal compounds such as titanium nitride or a tungstentitanium alloy increases the minimum processing temperature to 450° C. or greater.

With the pass transistor connected to the ferroelectric capacitor, the bit line associated with the column which includes many cells including the single cell of FIG. 6 must be formed. To isolate the bit line from portions of the memory cell other than the drain contact 62 of the pass transistor, a third insulating layer 64 is applied over the entire cell. A portion of the oxide layer is then etched, leaving the drain contact 62 exposed to provide a connection for the bit (or $\overline{bit}$) line (as shown in FIG. 6f).

Finally, as shown in FIG. 6g, a bit line 44, preferably consisting of a metal such as aluminum, is applied over the cell. Because only the drain contact 62 is exposed after etching the insulating layer 64, the bit line makes electrical contact only with the drain electrode 62, and is electrically insulated from the source and the upper contact of the capacitor (which are connected to one another by the local interconnect layer) by the remaining portion of the third insulating layer 64 which remains after etching. The bit line extends along the column and makes contact with the drain electrode of each cell in the column.

Figure 8:
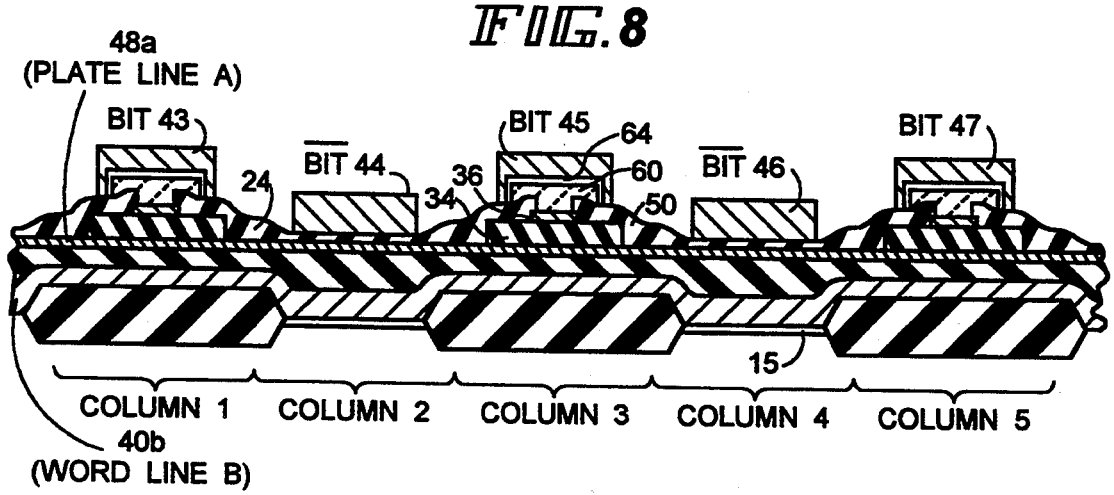
FIG. 8 is a cross section of the non-volatile memory array portion of FIG. 5 taken at lines 8—8.

Having shown the structure of a single cell, FIGS. 7 and 8, which are taken at lines 7—7 and lines 8—8 respectively of FIG. 5, are cross-sections of a portion of the memory array taken through a single row thereof at two locations within the row. These figures more clearly show the relationship between adjacent cells in a row and the relationship of the individual cells in a row to the pairs of word and plate lines associated with the row. Specifically, these cross-sections taken together show how (i) the pairs of word and plate lines are configured such that the plate line coupled to a cell is coincident with the word line coupled to an adjacent cell (i.e. a cell within a single row in an adjacent column), and (ii) the connected word line and the connected plate line of any given cell are not coincident. The cross-sections of FIGS. 7 and 8 are taken perpendicular to the cross-sections of FIGS. 6a–g.

Turning first to FIG. 7, the cross-section of the row is taken through the first pair of coincident word and plate lines (i.e. 40a which is word line A and 48b which is plate line B). Specifically, the cross-section is of a straight line section which goes through the gate electrodes of the transistors of the cells in columns 1, 3 and 5 and through the capacitors of the cells in columns 2 and 4. The first word line 40a acts as the gate electrodes for the transistors of these cells in columns 1, 3 and 5 of Row 2. The first plate line 48b extends across each column in the row and forms the bottom electrodes 32 of the capacitors 30 of the cells in alternating columns of the row (e.g. columns 2 and 4 of Row 2). Therefore, the first pair of coincident or co-linear word and plate lines 40a and 48b shown in the cross-section of FIG. 7, each of which makes connections to mutually exclusive alternating cells, does not make connections to the same cell. That is to say, if word line 40a connects to a cell, then plate line 48b does not, and vice-versa. As will become apparent in reference to FIG. 8, a cell which is connected to a word line of the first pair of coincident word and plate lines will be connected to the plate line of the second pair of coincident word and plate lines.

The cross-section in FIG. 8 is a cross-section taken through the second pair of word and plate lines also associated with the Row 2. Like the first pair of word and plate lines associated with the row, the second word line and plate line are coincident or co-linear but separated from each other by an insulating layer. Also, both the second word line 40b (or word line B) and the plate line 48a (or plate line A) are connected to every second cell. However, the second word line forms the connection for the gate electrode for the transistors in the cells in columns 2 and 4, and the second plate line forms the bottom electrode of the capacitor in the cells in columns 1, 3 and 5. Therefore, any cell is connected either to the first word line and the second plate line or the second word line and the first plate line.

In other words, for each row in the present embodiment there are two word lines and two plate lines. Preferably, each word line is "coincident" with a corresponding one of the plate lines, as shown illustratively in FIG. 6d. Preferably, each word line is separated vertically from its corresponding plate line. This vertical structure improves the utilization of substrate area. One plate line may be narrower or wider than the word line with which it is paired, or may be the same in width, but the paired lines are generally co-linear in the sense that they both traverse columns together at generally the same places, as shown in the figures. Each ferroelectric non-volatile memory cell in a column is coupled to one part of one pair and the other part of the other pair. That is, any cell is coupled to either the plate line of the first pair and the word line of the second pair, or the plate line of the second pair and the word line of the first pair. The capacitor of that same memory cell is connected likewise so that if the first word line is coupled to (i.e. forms the gate electrode of) the pass transistor, then the plate line of the other pair is coupled to (i.e. forms the other plate of) that capacitor.

Finally, as is apparent in FIG. 5, adjacent rows form a mirror image of one another. For example, Row 1 is a mirror image of Row 2, and Row 2 is a mirror image of Row 3. This arrangement allows for pairs of transistors in each column to share a common drain, allowing the rows to be positioned closer together. This arrangement further reduces the size of the memory, i.e. the substrate area required for a given number of memory cells.

Therefore, the present invention provides a non-volatile ferroelectric cell having folded bit lines which is designed to both reduce the size of the memory cell while also eliminating noise interference commonly associated with non-volatile ferroelectric cells having an open bit line architecture.

While this invention has been described with reference to an illustrative embodiment, it will be understood that this description is not intended to be construed in a limiting sense, but is intended to include any substitutes within the spirit and scope of the invention. Various modifications of the illustrative embodiment, as well as other embodiments of the invention, will become apparent to those skilled in the art upon reference to this description. For example, it is preferable but not required that the pairs of word and plate lines be aligned or even overlap. Rather, each word line is associated with a given plate line and is separated from the plate line by an insulating layer. It may also be possible to use more than two pairs of plate line/word lines.

The materials used in executing this architecture can be varied or selected by the process or design engineer to suit their respective requirements, without departing from the scope of the present invention. For example, common choices for conductive lines include doped polysilicon, "polycide" which is a polysilicon stacked with a metal, usually a refractory metal such as tungsten or titanium, pure or alloyed metals including aluminum for instance, conductive compounds, including conductive oxides and conductive nitrides, noble metals, and other known materials. The invention is intended to be set forth in the appended claims.

I claim:

1. A non-volatile ferroelectric memory array having folded bit lines including a plurality of cells arranged in rows and columns, each cell having a respective transistor and a respective ferroelectric capacitor, the transistor having a first electrode, a second electrode and a control electrode, and the ferroelectric capacitor having first and second plates with a ferroelectric material therebetween, wherein the second electrode of the transistor of each cell is coupled to the first plate of the ferroelectric capacitor of the cell, the memory array comprising:

a plurality of bit lines wherein each bit line is associated with a column and is coupled to the first electrode of each said transistor in the column;

a plurality of word lines and corresponding plate lines wherein a first pair and a second pair of the word and corresponding plate lines are associated with a row, said word lines being coincident with said corresponding plate lines in plan view;

wherein the word line of the first pair of the coincident word and plate lines associated with the row is coupled to the control electrodes of the transistors of a first group of alternating cells in the row;

wherein the word line of the second pair of the coincident word and plate lines associated with the row is coupled to the control electrodes of the transistors of a second group of alternating cells in the row;

wherein the plate line of the second pair of the coincident word and plate lines associated with the row is coupled to the second plates of the ferroelectric capacitors of the first group of alternating cells in the row; and wherein the plate line of the first pair of the coincident word and plate lines associated with the row is coupled to the second plates of the ferroelectric capacitors of the second group of alternating cells in the row.

2. The non-volatile ferroelectric memory array of claim 1 wherein said coincident word and plate lines are separated by an insulating layer.

3. The non-volatile ferroelectric memory array of claim 1 wherein one of said coincident lines of each said pair of the coincident word and plate lines overlies at least part of the other coincident line in cross-section view.

4. The non-volatile ferroelectric memory array of claim 1 wherein said coincident word and plate lines are aligned such that one of the lines of each said pair in vertical cross section overlaps the other said line.

5. The non-volatile ferroelectric memory array of claim 1 wherein the transistors are n-channel field effect transistors.

6. The non-volatile ferroelectric memory array of claim 1 wherein the ferroelectric material includes $Pb(Ti_xZr_{(1-x)})O_3$ where x is a number between 0.2 and 0.8.

7. The non-volatile ferroelectric memory array of claim 1 wherein the ferroelectric material is selected from a group of materials consisting of potassium nitrate, bismuth titanate and compounds comprising lead zirconate titanate.

8. The non-volatile ferroelectric memory array of claim 1 wherein the second electrodes of the transistors are coupled to the first platen of the capacitors by a material selected from a group consisting of a refractory metal, refractory metal nitride, refractory metal silicide or a conductive oxide.

9. The non-volatile ferroelectric memory array of claim 8 wherein the first plates of the capacitors consist of platinum.

10. The non-volatile ferroelectric memory array of claim 1 wherein the transistors in pairs of adjacent cells in each column share drain regions.

11. The non-volatile ferroelectric memory array of claim 1 wherein adjacent rows are mirror images of one another.

12. A non-volatile ferroelectric memory array having folded bit lines comprising:

a plurality of cells arranged substantially in rows and columns, each cell including a respective n-channel field effect transistor and a respective ferroelectric capacitor;

wherein each transistor has a first electrode, a second electrode and a control electrode and each capacitor has a first plate and a second plate and a ferroelectric material between said plates and wherein the second electrode of the transistor is coupled to the first plate of the capacitor;

wherein the ferroelectric material of the ferroelectric capacitor includes $Pb(Ti_xZr_{(1-x)})O_3$ where x is a number between 0.2 and 0.8;

a plurality of bit lines wherein each bit line is associated with a given column and is connected to the first electrode of each transistor in the given column;

a first pair of word and plate lines associated with a row, said word line being coincident with said plate line in plan view;

a second pair of word and plate lines associated with the row, said word line being coincident with said plate line in plan view;

wherein the word line of the first pair of the coincident word and plate lines associated with the row is coupled to the control electrodes of the transistors of a first group of alternating cells in the row;

wherein the plate line of the second pair associated with the row is coupled to the second plates of the ferroelectric capacitors of the first group of alternating cells in the row;

wherein the word line of the second pair of the coincident word and plate lines associated with the row is coupled to the control electrodes of the transistors of a second group of alternating cells in the row, the second group being different from the first group; and wherein the plate line of the first pair associated with the row is coupled to the second plates of the ferroelectric capacitors of the second group of alternating cells in the row.

13. A method of forming a ferroelectric memory array having folded bit lines with cells arranged substantially in columns and rows including the steps of:

coupling a transistor and a ferroelectric capacitor for each cell, the transistor having a first electrode, a second electrode and a control electrode and the ferroelectric capacitor having first and second plates, wherein the second electrode of the transistor is coupled to the first plate of the ferroelectric capacitor;

coupling a bit line associated with each column to the first electrode of each transistor in the column;

providing a first pair of word and plate lines and a second pair of word and plate lines associated with a row, said word lines being coincident with said corresponding plate lines in plan view;

coupling the word line of the first pair of the coincident word and plate lines associated with the row to the control electrodes of the transistors of a first group of alternating cells in the row;

coupling the word line of the second pair of the coincident word and plate lines associated with the row to the control electrodes of the transistors of a second group of alternating cells in the row;

coupling the plate line of the second pair associated with the row to the second plates of the ferroelectric capacitors of the first group of alternating cells in the row; and coupling the plate line of the first pair associated with the row to the second plates of the ferroelectric capacitors of the second group of alternating cells in the row.

* * * * *